(12) United States Patent
Vacca Cavalotto et al.

(10) Patent No.: US 9,024,678 B2
(45) Date of Patent: May 5, 2015

(54) CURRENT SENSING CIRCUIT ARRANGEMENT FOR OUTPUT VOLTAGE REGULATION

(71) Applicant: Infineon Technologies AG, Neubiberg (DE)

(72) Inventors: Daniele Vacca Cavalotto, Valperga (IT); Enrico Orietti, Pozzonovo (IT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/899,626

(22) Filed: May 22, 2013

(65) Prior Publication Data

US 2014/0347119 A1    Nov. 27, 2014

(51) Int. Cl.
*H03K 17/72* (2006.01)
*H03K 17/14* (2006.01)

(52) U.S. Cl.
CPC .................. *H03K 17/145* (2013.01)

(58) Field of Classification Search
USPC ................... 327/434, 530–546; 323/312–317
See application file for complete search history.

(56) References Cited

U.S. PATENT DOCUMENTS

| | | | |
|---|---|---|---|
| 5,892,389 A * | 4/1999 | Lai | 327/543 |
| 5,973,551 A * | 10/1999 | Mitsuda | 327/543 |
| 6,992,473 B2 | 1/2006 | Marschalkowski et al. | |
| 7,141,955 B1 * | 11/2006 | Martinez | 323/272 |
| 7,365,592 B2 * | 4/2008 | Hirayama | 327/536 |
| 7,576,526 B2 * | 8/2009 | Kimura | 323/277 |
| 7,659,706 B2 * | 2/2010 | Nishida | 323/314 |
| 8,203,365 B2 * | 6/2012 | Valentino et al. | 327/77 |
| 2002/0030475 A1 * | 3/2002 | D'Angelo | 323/316 |
| 2007/0263334 A1 * | 11/2007 | Nishida | 361/103 |
| 2008/0094111 A1 * | 4/2008 | Nakamori et al. | 327/108 |
| 2009/0179621 A1 * | 7/2009 | Kimura | 323/265 |
| 2010/0073034 A1 * | 3/2010 | Valentino et al. | 327/77 |
| 2010/0176874 A1 * | 7/2010 | Sugiura et al. | 327/537 |

OTHER PUBLICATIONS

Cheung Fai Lee and Philip K. T. Mok A Monolithic Current-Mode CMOS DC-DC Converter With On-Chip Current-Sensing Technique IEEE Journal of Solid-State Circuits, vol. 39, No. 1, January 2004; pp. 3-14.
Yuang-Shung Lee and Chih-Jen Hsu High Accuracy CMOS Current Sensing Circuit for Current Mode Control Buck Converter PEDS 2007; pp. 44-48.

* cited by examiner

*Primary Examiner* — Brandon S Cole

(57) ABSTRACT

A circuit arrangement including a first transistor, a second transistor and a third transistor. The first transistor and the second transistor are configured so that the current flowing through the first transistor is proportional to the current flowing through the second transistor and the third transistor. The first transistor, the second transistor and the third transistor are configured to operate in an ohmic mode. The second transistor and the third transistor are coupled in series to each other. The first transistor, the second transistor and the third transistor match each other in at least one characteristic.

19 Claims, 4 Drawing Sheets

CURRENT SENSING CIRCUIT ARRANGEMENT FOR OUTPUT VOLTAGE REGULATION

TECHNICAL FIELD

Various embodiments relate generally to a circuit arrangement. The circuit arrangement may be used for current sensing.

BACKGROUND

Current sensing may be used, for example, for output voltage regulation or to achieve overcurrent protection. A low-valued sense resistor may be placed in series with a current path. The current path may carry the current that is to be sensed. The current flowing through the sense resistor may produce a small voltage drop. The voltage drop may be amplified to provide a signal proportional to the current. The voltage drop across the sense resistor may, for example, be converted into a current. The sense resistor may be external to an integrated power circuit due the unavailability of integrated precision resistors that can handle high current levels.

The current levels may be reduced by a current mirror which may provide a smaller yet proportional current to the current that is to be sensed. However, the mirrored current doesn't contribute to the current flowing through the load so that the overall efficiency of the circuit may be reduced.

The current levels may also be reduced by portioning-off a small amount of current to flow through the sense resistor. The portioned-off current may be fed back to flow through the load so that no current is lost through the sensing. The voltage drop across the sense resistor may, for example be converted into a current, for example by an operational transconductance amplifier (OTA). However, the resistance of the sense resistor and the resistance of the amplifier used for voltage to current conversion (transconductance amplifier) may differ from each other by several orders of magnitude and may depend on the production process and the temperature.

Further, the on-resistance of a switching element of an integrated power circuit may depend strongly on its temperature, its production process and its overdrive voltage. This may lead to a large spread in the current that is sensed. However, it is frequently required that current sensing has to be stable and accurate over variations in temperature and supply voltage.

SUMMARY

In accordance with various embodiments a circuit arrangement is provided, including a first transistor, a second transistor and a third transistor. The first transistor, the second transistors and the third transistors may be configured so that the current flowing through the first transistor is proportional to the current flowing through the second transistor and the third transistor. The first transistor, the second transistor and the third transistor may be configured to operate in an ohmic mode. The second transistor and the third transistor may be coupled in series with each other. The first transistor, the second transistor and the third transistor match each other in at least one characteristic. The circuit arrangement may be used for current sensing in converters, for example, in a synchronous buck converter, a boost converter, a buck converter, a switched mode power supply, and in other current sensing applications.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the drawings, the left-most digit(s) of a reference number can identify the drawing in which the reference number first appears. The same numbers can be used throughout the drawings to reference like features and components. In the following description, various embodiments of the invention are described with reference to the following drawings, in which.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

Figure 1:
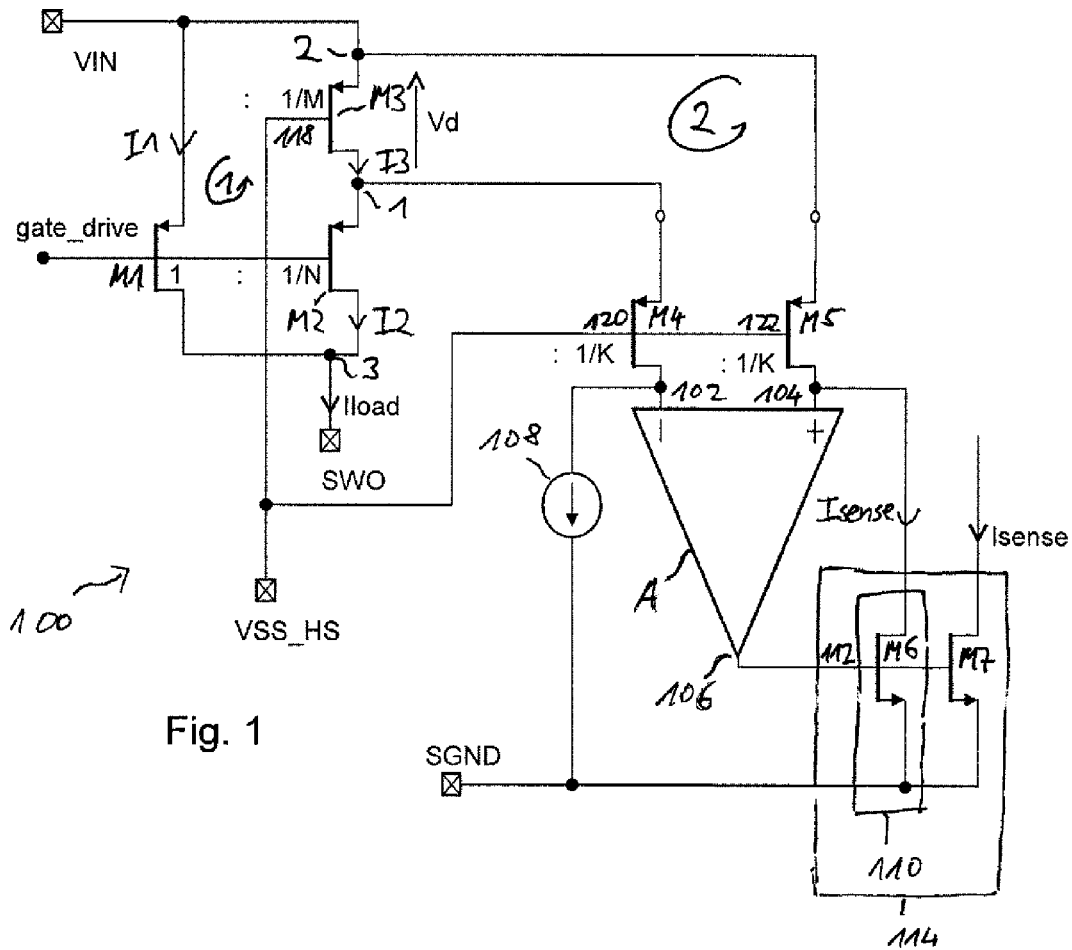
FIG. 1 shows a circuit arrangement according to various embodiments.

FIG. 1 shows a circuit arrangement 100 according to various embodiments. The circuit arrangement 100 may be configured for high-side current sensing. In high-side current sensing, the sense resistor is placed between the supply and the load. The circuit arrangement 100 may include a first transistor M1, a second transistor M2 and a third transistor M3. The first transistor M1, the second transistor M2 and the third transistor M3 may be configured so that the current I1 flowing through the first transistor M1 is proportional to the current I2 flowing through the second transistor M2 and the third transistor M3. The proportionality between the first transistor M1 and the second transistor M2 may be set by a factor N. Factor N may be an integer. It may be in the range of 10 to 10,000. It may be in the range of 100 to 1,000. It may be approximately 100. Factor N may be set by designing the width W to length L ratio W/L of the second transistor to be smaller by a factor N than the width W to length L ratio W/L of the first transistor M1. Only a small portion of the current I1 flowing through transistor M1 flows through transistors M2 and M3, and current I2 contributes also to the load current Iload. The first transistor M1 and the second transistor M2 may share a common input at their respective control input, for example at their respective gates. Their control inputs may be connected to a signal gate_drive. Signal gate_drive may be provided by a driver stage of a power integrated circuit. It may be a digital signal with two states, for example a logic low state and a logic high state. The first transistor M1 and the second transistor M2 may be conducting in one logic state and be nonconducting in the other logic state. The low logic state may be, for example, gate_drive=VIN; the high logic state may be, for example, gate_drive=VSS_HS. A first terminal of the first transistor M1 and a first terminal of the second transistor M2 may be coupled to the terminal SWO. A second terminal of the first transistor M1 may be coupled to the potential YIN.

The first transistor M1 may be a power transistor, for example a power field effect transistor (FET), for example a power metal-oxide-semiconductor field effect transistor (MOSFET) or a vertical diffused MOSFET (VDMOS) or a double-diffused MOSFET (DMOS). It may be a switching element of a power integrated circuit. It may be used to control a current Iload flow through a load. The load, which is not shown in FIG. 1, may be coupled to the terminal SWO.

The third transistor M3 may be coupled in series to the second transistor M2. It may have a first terminal coupled to a second terminal of the second transistor M2 and a second terminal coupled to the second terminal of the first transistor M1. The series arrangement of the second transistor M2 and the third transistor M3 may be coupled in parallel to the first transistor M1.

The first transistor M1, the second transistor M2 and the third transistor M3 may be configured to operate in an ohmic mode, that it, the voltage across the transistor and the current flowing through the transistor may be proportional to each other. The ohmic mode of operation may also be referred to as a linear mode of operation.

The third transistor M3 may be used as a sense resistor for a current I3 flowing through it. The voltage Vd across the third transistor M3 may be measured and the current I3 flowing through the third transistor M3 may be calculated from the voltage Vd and the resistance Rd of the third transistor M3, for example by $$I3 = Vd/R. \quad (1)$$

The resistance R may be an on-resistance Ron of the transistor. For a generic n-type MOSFET working in ohmic or linear region it may be given by:

$$Ron = 1/(\mu n \, Cox(W/L)(Vgs-Vth)) \quad (2)$$

where $\mu n$ is the mobility of electrons, Cox is the oxide capacitance, W/L is the ratio between width W and length L of the active area of the device, Vgs is the gate-to-source voltage, Vth is the threshold voltage.

The on-resistance value for a generic p-type MOSFET working in ohmic or linear region may be given by $$Ron = 1/(\mu p \, Cox(W/L)(Vsg+Vth)) \quad (3)$$

where $\mu p$ is the mobility of holes, Cox is the oxide capacitance, W/L is the ratio between width W and length L of the active area of the device, Vsg is the source-to-gate voltage, Vth is the threshold voltage, where Vth is negative in the case of p-type MOSFETs.

The resistance R may be set by a factor M and the voltage VSS_HS applied to a control gate 118 of the third transistor M3. Factor M may be an integer. It may be in the range of 10 to 10,000. It may be in the range of 100 to 1,000. It may be approximately 100. Factor M may be set by designing the width W to length L ratio W/L of the third transistor M3 to be smaller by a factor M than the width W to length L ratio W/L of the first transistor M1.

The first transistor M1, the second transistor M2 and the third transistor M3 may match each other in at least one characteristic. The characteristic may be one of a transistor type, a temperature, a location, and a production process. For example, first transistor M1, the second transistor M2 and the third transistor M3 may all be p-type transistors, for example PMOS-FETs. They may be monolithically integrated, for example in a common substrate. In this way, they may be at the same location and have the same temperature during operation so that effects due to different temperature sensitivities may be reduced. They may be produced with the same production process, so that they share the same production parameters. In this way, the influence of production parameter variations may be reduced. Since the first transistor M1, the second transistor M2 and the third transistor M3 may match each other in at least one characteristic, they will also match each other in at least one electrical property or characteristic. The matching of the at least one electrical property or characteristic may be used to eliminate the effect of variations in the at least one electrical property or characteristic since the effect may cancel.

The circuit arrangement 100 may further include an amplifier A. Amplifier A may have an input, or to be more precise, a first input 102 and a second input 104, and an output 106. It may be configured to convert a voltage, for example voltage Vd, at its input 102, 104 into a current at its output 106. Amplifier A may be an operational transconductance amplifier (OTA), however, different amplifying structures can be used. The input 102, 104 of the amplifier A may be coupled to the third transistor M3 and amplifier A may amplify the voltage drop Vd across the third transistor M3.

The circuit arrangement may further include a fourth transistor M4 coupled between the first terminal of the third transistor M3 and the first input 102 of the amplifier A. The circuit arrangement may further include a fifth transistor M5 coupled between the second terminal of the third transistor M3 and the second input 104 of the amplifier A. A control input 120 of the fourth transistor M4 and a control input 122 of the fifth transistor M5 may be coupled together. Similar to the third transistor M3, the fourth transistor M4 and the fifth transistor M5 may be configured to operate in an ohmic mode. Their resistance may be set by a factor K and by applying a voltage VSS_HS to the control gate 120 of the fourth amplifier M4 and to the control gate 122 of the fifth amplifier M5. Factor K may be an integer. It may be in the range of 10 to 10,000. It may be in the range of 100 to 1,000. It may be approximately 100. The factor K may be far larger than the factor M or the factor N, for example it may be 10 to 100 times larger. In this way, the sense current Isense may be far smaller than current I1 and current I2. A smaller current may be easier to handle and may reduce the current consumption. The factor K may be set by designing the width W to length L ratio W/L of the fourth transistor M4 and fifth transistor M5 to be smaller by a factor K than the width W to length L ratio W/L of the first transistor M1. The fourth transistor M4 and fifth transistor M5 may have the same resistance.

Similar to the first transistor M1, the second transistor M2 and the third transistor M3 matching each other in at least one characteristic, the fourth transistor M4 and the fifth transistor M5 may also match each other in at least one characteristic, leading to the same advantages. The characteristic may again be one of a transistor type, a temperature, a location, and a production process. Similar to the first transistor M1, the second transistor M2 and the third transistor M3 being monolithically integrated in a common substrate, the fourth transistor M4 and the fifth transistor M5 may also be monolithically integrated in a common substrate, leading to the same advantages.

The first transistor M1, the second transistor M2, the third transistor M3, the fourth transistor M4 and the fifth transistor M5 may match each other in at least one characteristic and they may be monolithically integrated in a common substrate, leading to the above mentioned advantages.

The circuit arrangement 100 may further include a feedback structure 110 configured to couple the output 106 of amplifier A to an input of amplifier A. The feedback structure 110 may include a sixth transistor M6, although other feedback structures are possible. The sixth transistor M6 may be a n-type transistor, for example a n-type field effect transistor NFET, for example a NMOSFET. It may include a control input 112 that may be coupled to the output 106 of amplifier A. The sixth transistor M6 may include a controlled path. The current in the controlled path may be controlled by a signal at the control input 112 of the sixth transistor M6. The controlled path of the sixth transistor M6 may be coupled between an input, for example the second input 104, of amplifier A and a reference potential, for example a signal ground SGND.

The circuit arrangement 100 may further include a reproducing structure 114, for example for copying or scaling a current through the feedback structure 110. The reproducing structure 114 may include a first branch, a second branch and a control input. The first branch may include the feedback 110, for example the sixth transistor M6. The second branch may provide a current proportional to the current in the first branch and may include a seventh transistor M7. The seventh transistor M7 may be the same type of transistor as the sixth transistor M6. It may be a n-type transistor, for example a n-type MOSFET. The control input of the sixth transistor M6 and the control input of the seventh transistor M7 may be coupled to each other and may form the control input of the reproducing structure 114. The control input of the reproducing structure 114 may be coupled to the output 106 of the amplifier A. The same current may flow in the first branch and in the second branch. For example, a current Isense may flow through the first branch and a current Isense may flow through the second branch. However, the current in the first branch and the current in the second branch do not need to be the same, they may for example be proportional to each other.

The circuit arrangement 100 may further include a biasing structure 108 configured to bias amplifier A. The biasing structure may include a current source 108. The current source 108 may be coupled between a reference potential and an input of the amplifier A to which the feedback structure 110 is not coupled. The current source 108 may provide a current Iped. The reference potential may be the potential of signal ground, for example SGND. The input of the amplifier A to which current source 108 is coupled may be the first input 102 of amplifier A. The biasing structure may be used to provide a threshold, a cut off, a bias, a pedestal or reference value which may used in current sensing and will be described in greater detail in conjunction with FIGS. 4 to 7.

A control input 118 of the third transistor M3, a control input 120 of the fourth transistor M4 and a control input 112 of the fifth transistor M5 may be coupled to each other and may be supplied with a common voltage. The control input may be the gate of the respective transistor. The voltage may be VSS_HS and may be chosen to operate the third transistor M3, the fourth transistor M4 and the fifth transistor M5 in a linear or ohmic region. When the voltage VSS_HS is applied as the signal gate_drive to the inputs of the first transistor M1 and the second transistor M2, these transistors may also operate in a linear region. This may for example be the case when the power is switched on.

Applying Kirchhoff's current law to node 3 of circuit arrangement 100 yields:

$$Iload=I1+I2 \quad (4)$$

where Iload is the current flowing through a load connected at a terminal SWO, I1 is the current flowing through the first transistor M1, and I2 is the current flowing through the second transistor M2.

Because current Iped is usually negligible compared to current I2 and no current or only a small current flows into the amplifier A, it may be assumed that $$I2=I3 \quad (5)$$

where I3 is the current flowing in the third transistor M3.

Assuming that the first transistor M1 has a resistance R, which may for example be its on-resistance Ron, that is, a resistance that the first transistor M1 has when it is conducting, the second transistor M2 may have a resistance N·R, and the third transistor M3 may have a resistance M·R. Applying Kirchhoff's voltage law to loop 1 yields:

$$R \cdot I1 = N \cdot R \cdot I2 + M \cdot R \cdot I3 \quad (6)$$

which simplifies to $$I1 = N \cdot I2 + M \cdot I3 \quad (7)$$

Substituting Eq. (7) in Eq. (4) and using Eq. (5) yields:

$$I2=I3=Iload/(1+N+M) \quad (8)$$

and $$Vd=M \cdot R \cdot I3=Iload \cdot M \cdot R/(1+N+M) \quad (9)$$

The transconductance amplifier A will force $$Isense=Vd/(K \cdot R)+Iped=Iload \cdot M/(K \cdot (1+M+N))+Iped \quad (10)$$

The current Iload may be determined from a measurement of current Isense and Iped. The relationship between current Iload and current Isense may be linear. If Iped=0, the relationship between current Iload and current Isense may be proportional. By matching the first transistors M1, the second transistor M2, the third transistor M3, the fourth transistor M4 and the fifth transistor M5 to each other in at least one characteristic, which may for example be the same transistor type and a same production process, any change in the resistance R of the first transistor M1 will also be present in the resistance N·R of the second transistor M2, in the resistance M·R of the third transistor M3 and of the resistances of K·R of the fourth transistor M4 and the fifth transistor M5. As a consequence, the corresponding variations in resistance may cancel. Since the third transistor M3, the fourth transistor M4 and the fifth transistor M5 share the same gate voltage, the effects of variations in voltage VSS_HS may also be reduced. Thus, the dependency of resistance R on temperature, on the process used for production and overdrive voltage may be reduced. Current Iload may therefore be sensed in a stable and accurate manner over variations in temperature and supply voltage.

The only parameters present in equation 8 are the factors N, M and K. However, the factors N, M and K can be implemented with high accuracy, for example when the first transistors M1, the second transistor M2, the third transistor M3, the fourth transistor M4 and the fifth transistor M5 are manufactured using the same production process.

Figure 2:
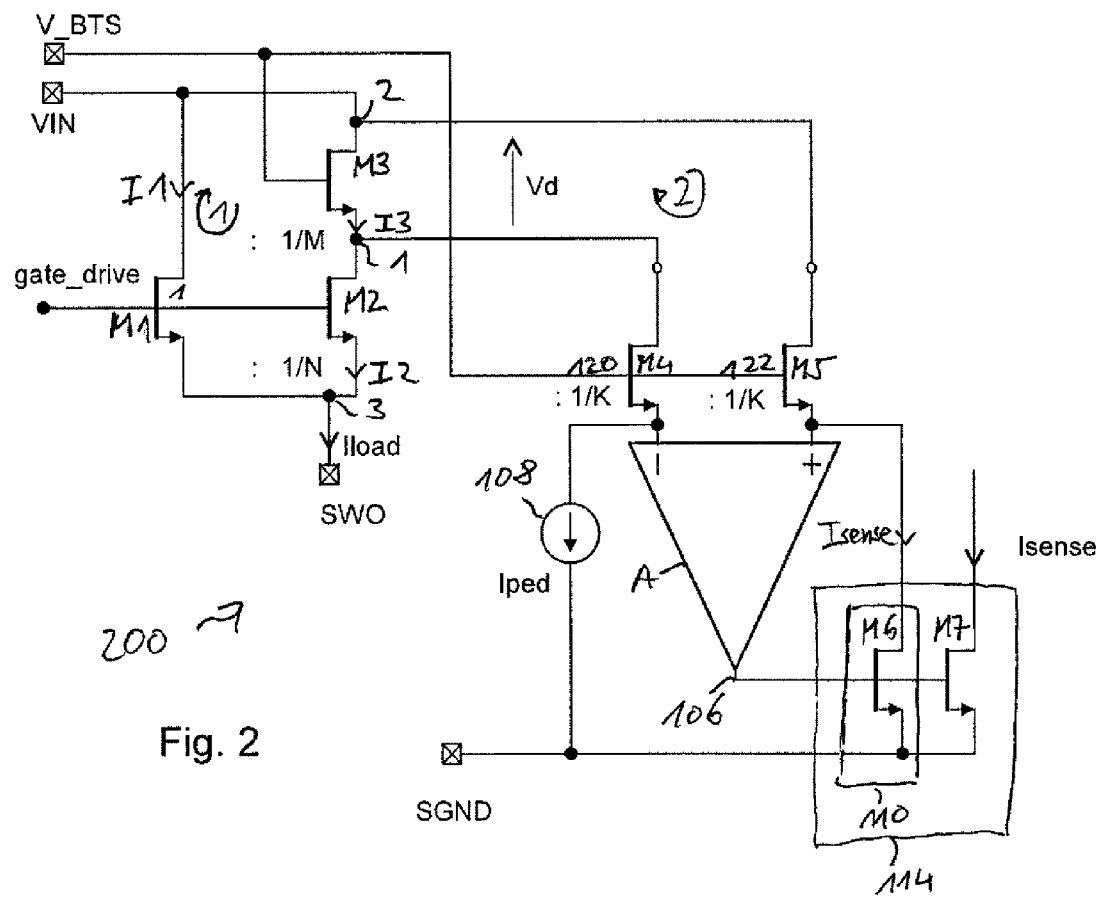
FIG. 2 shows a circuit arrangement according to various embodiments.
Figure 3:
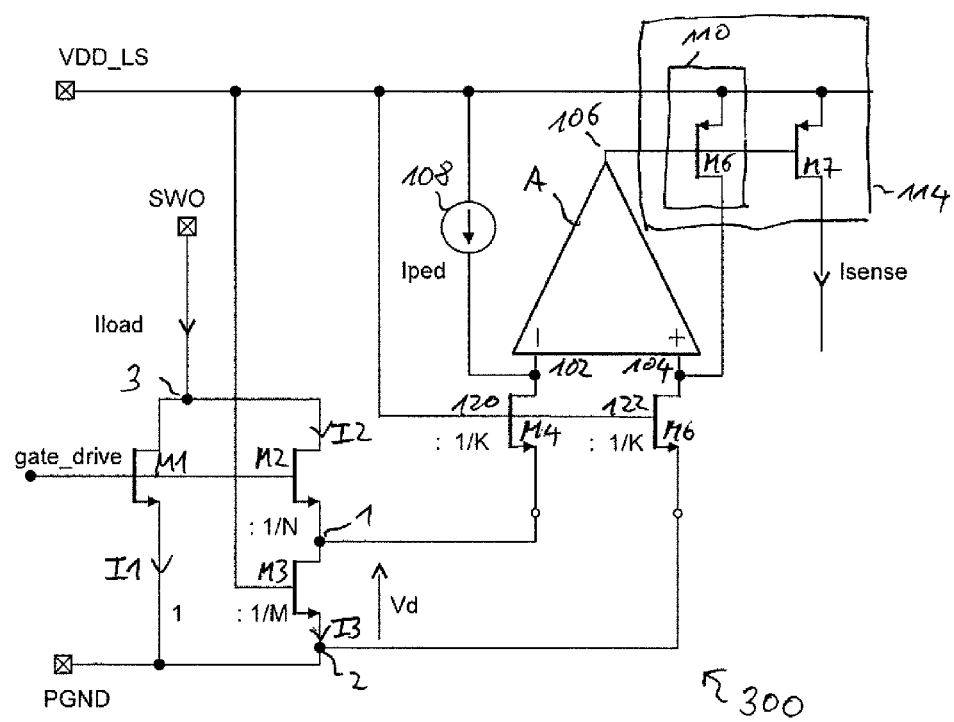
FIG. 3 shows a circuit arrangement according to various embodiments.

The circuit arrangement 100 shown in FIG. 1 uses highside current sensing. The first transistor M1, the second transistor M2, the third transistor M3, the fourth transistor M4 and the fifth transistor M5 may be PFETs, that is p-type channel field effect transistors, for example p-channel metal-oxide semiconductor field-effect transistors (PMOSFETs) or p-channel junction gate transistors (PJFETs). The sixth transistor M6 and the seventh transistor M7 may be NFETs, that is n-type channel field effect transistors, for example n-channel metal-oxide semiconductor field-effect transistors (NMOSFETs) or n-channel junction gate transistors (NJFETs). FIG. 2 and FIG. 3 show alternative embodiments of the circuit arrangement.

FIG. 2 shows a circuit arrangement 200 according to various embodiments. The description and the principle of operation may be the same as for the circuit arrangement 100 shown in FIG. 1. Like circuit arrangement 100, the circuit arrangement 200 may be configured for high-side current sensing. In contrast to circuit arrangement 100, the first transistor M1, the second transistor M2, the third transistor M3, the fourth transistor M4, and the fifth transistor M5 are no longer p-type transistors, but may be n-type transistors. The sixth transistor M6 and the seventh transistor M7 may be n-type transistors.

The first transistor M1, the second transistor M2 and the third transistor M3 may match each other in at least one characteristic. The fourth transistor M4 and the fifth transistor M5 may also match each other in at least one characteristic, leading to the above mentioned advantages. The characteristic may again be one of a transistor type, a temperature, a location, and a production process. The first transistor M1, the second transistor M2 and the third transistor M3 being monolithically integrated in a common substrate. The fourth transistor M4 and the fifth transistor M5 may also be monolithically integrated in a common substrate, leading to the above mentioned advantages. The first transistor M1, the second transistor M2, the third transistor M3, the fourth transistor M4 and the fifth transistor M5 may match each other in at least one characteristic and they may be monolithically integrated in a common substrate, leading to the above mentioned advantages.

The control inputs of the third transistor M3, the fourth transistor M4, and the fifth transistor M5 may be supplied with a voltage V_BTS. In steady state condition V_BTS may be given by V_BTS=V_SWO+Vdrive, where V_SWO is the potential of terminal SWO and Vdrive may for example be 5.0 V. Again, the third transistor M3, the fourth transistor M4 and the fifth transistor M5 share a common potential at their gates, so that variations in overdrive voltages may be reduced.

FIG. 3 shows a circuit arrangement 300 according to various embodiments. The description and the operation may be the same as for the circuit arrangement 100 shown in FIG. 1. The circuit arrangement 300 may be configured for low-side current sensing. In low-side current sensing, the sense resistor is placed between the load and the circuit ground.

In contrast to circuit arrangement 100, the first transistor M1, the second transistor M2, the third transistor M3, the fourth transistor M4 and the fifth transistor M5 are no longer p-type transistors, but n-type transistors. The sixth transistor M6 and the seventh transistor M7 are no longer n-type transistors, but may be p-type transistors.

The control inputs of the third transistor M3, the fourth transistor M4, and the fifth transistor M5 may be supplied with a voltage VDD_LS. Again, the third transistor M3, the fourth transistor M4 and the fifth transistor M5 share a common potential at their gates, so that variations in overdrive voltages may be reduced. The signal gate_drive may be equal to V_PGND when the power switch is off, and may be equal to VDD_LS when the power switch is on.

The first transistor M1, the second transistor M2 and the third transistor M3 may match each other in at least one characteristic. The fourth transistor M4 and the fifth transistor M5 may also match each other in at least one characteristic, leading to the above mentioned advantages. The characteristic may again be one of a transistor type, a temperature, a location, and a production process. The first transistor M1, the second transistor M2 and the third transistor M3 being monolithically integrated in a common substrate. The fourth transistor M4 and the fifth transistor M5 may also be monolithically integrated in a common substrate, leading to the above mentioned advantages. The first transistor M1, the second transistor M2, the third transistor M3, the fourth transistor M4 and the fifth transistor M5 may match each other in at least one characteristic and they may be monolithically integrated in a common substrate, leading to the above mentioned advantages.

Figure 4:
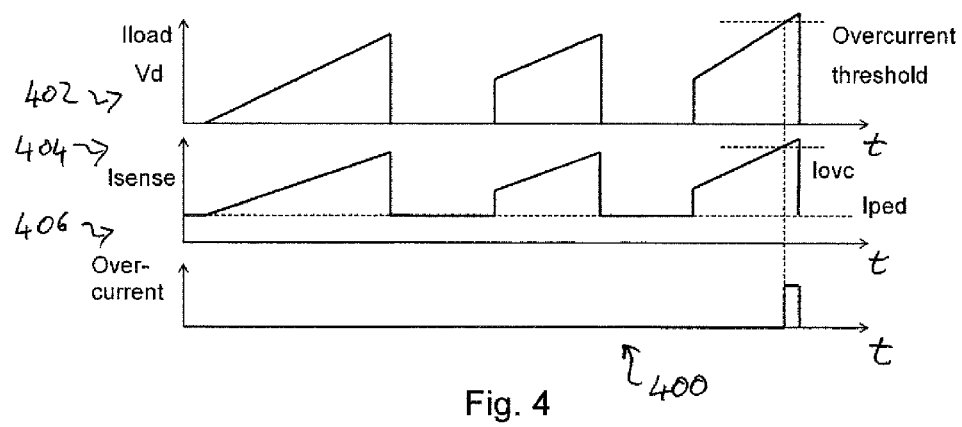
FIG. 4 shows diagrams of waveforms of a circuit arrangement according to various embodiments.

FIG. 4 shows diagrams 402, 404 and 406 of signal waveforms of a circuit arrangement according to various embodiments.

Diagram 402 shows voltage Vd across the sense resistor and current Iload flowing through a load over time t. The third transistor M3 may be operated in an ohmic mode and may be used as a sense resistor. Voltage Vd may be measured and current Iload may be determined from it since they may be proportional to each other. Diagrams 402 shows three pulse of a current Iload. The first two pulses are below an overcurrent threshold, the third pulse exceeds the overcurrent threshold.

Diagram 404 shows current Isense over time t. As shown above, current Isense may have a linear dependency over current Iload. It may have an offset, a pedestal, or bias of a current Iped, which may be set by the biasing structure, for example the current source 108. Current Isense may be measured via voltage Vd and may be used to determine current Iload. Diagrams 404 shows three pulse of current Isense, which correspond to the three pulses of current Iload shown in diagram 402. The first two pulses are below a sensing threshold Iovc, the third pulse exceeds the sensing threshold.

Diagram 406 shows an overcurrent signal over time. The overcurrent signal may be output whenever the current Isense exceeds the sensing threshold Iovc. Current Isense does not exceed the sensing threshold Iovc in the first two pulses shown in diagram 404. However, the third pulse exceeds the sensing threshold Iovc and an overcurrent signal is output. While the overcurrent signal is shown as a pulse, it may also remain at a high level. Since Iload has a linear relationship with Isense, the overcurrent signal may be used to indicate that Iload has exceeded an overcurrent threshold.

Figure 5:
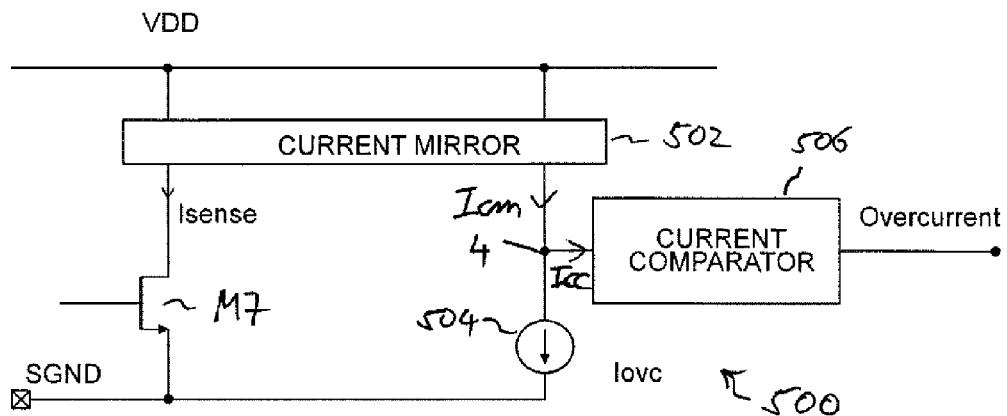
FIG. 5 shows an overcurrent detection circuit according to various embodiments.

FIG. 5 shows an embodiment of an overcurrent detection circuit 500. The overcurrent detection circuit 500 may be part of the circuit arrangements described above. It may include a current mirror 502, a current source 504 and a current comparator 506. The current Isense and the transistor M7 may correspond to current Isense and the seventh transistor M7 in the circuit arrangement 100, 200 and 300 shown in FIG. 1, FIG. 2 and FIG. 3, respectively. Current Isense may be mirrored by the current mirror 502 which may provide a current Icm. Current Icm may be proportional or equal to current Isense, for example Icm=Isense. Applying Kirchhoffs current law to node 4, the current Icc flowing into the current comparator 506 may be Icc=Icm−Iovc. Current Icc will be negative if current Icm is less than current Iocv provided by the current source 504. In this case, no overcurrent signal needs to be output by the current comparator 506. Current Icc will be positive if current Icm is greater than current Iocv. In this case, a overcurrent signal may be output by the current comparator 506, indicating that Isense and Iload, which may be proportional to Icm, have exceeded a threshold current. A possible waveform of the overcurrent signal is shown in diagram 406 of FIG. 4.

Figure 6:
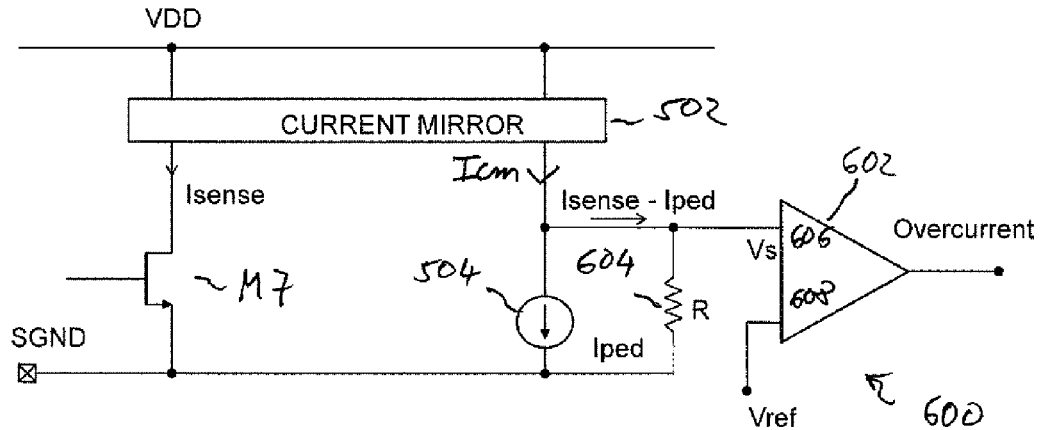
FIG. 6 shows an overcurrent detection circuit according to various embodiments.

FIG. 6 shows another embodiment of an overcurrent detection circuit 600. The overcurrent detection circuit 600 may be part of the circuit arrangements described above. The overcurrent detection circuit 600 may show details of the current comparator 506 shown in FIG. 5. The current mirror 502 may provide a copy of the current Isense, for example Icm=Isense. The current comparator 506 may include an amplifier 602 and a resistor 604. The resistor 604 is coupled across the current source 504. It may be monolithically integrated with at least some other parts of the circuit arrangement and may have a resistance R. The current source 504 may provide a current Iped. The current Iped may have the same value as the current Iped provided by the current source 108 shown in FIG. 1, FIG. 2 and FIG. 3. The amplifier 602 may be an operational amplifier. Assuming that no current flows into the amplifier 602, a current Isense−Iped will flow through the resistor 604 and provide a voltage Vs=R·(Isense−Iped) to the amplifier 602. One input 608 of the amplifier 602 may be connected to a reference potential Vref. The other input 606 of the amplifier 602 may be connected to one end of the resistor 604. If the voltage Vs is less than the reference voltage Vref, the amplifier 602 need not output an overcurrent signal. If the voltage Vs is greater than the reference voltage Vref, the amplifier 602 may output an overcurrent signal. As voltage Vs may have a linear relationship to Isense and since Isense may have a linear relationship to Iload, the overcurrent signal may indicate that Iload has exceeded a threshold current.

Figure 7:
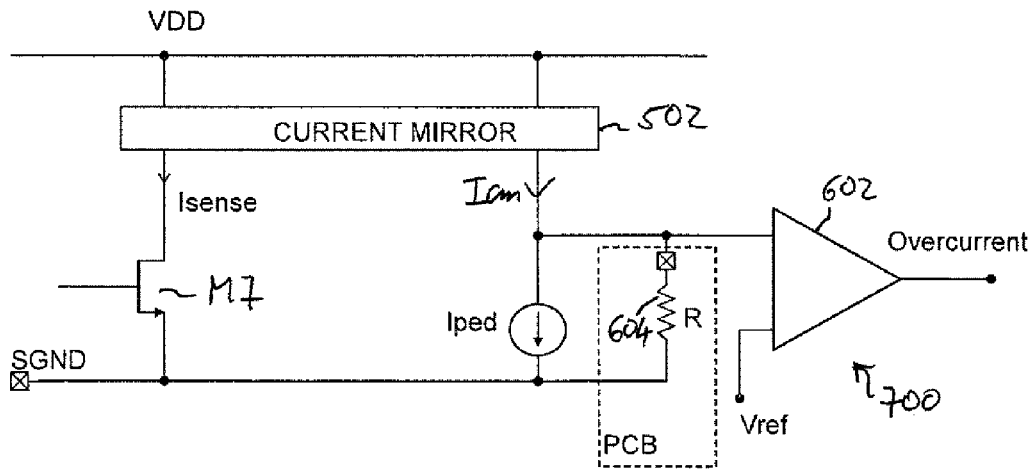
FIG. 7 shows an overcurrent detection circuit according to various embodiments.

FIG. 7 shows another embodiment of an overcurrent detection circuit 700. The overcurrent detection circuit 700 may be part of the circuit arrangements described above. The overcurrent detection circuit 700 may show a variation of the overcurrent detecting circuit 600 shown in FIG. 6. Resistor 604 may be arranged on a printed circuit board (PCB). It may be implemented as a discrete component. It may be arranged outside or external to the circuit arrangement. In other words, it needs not to be monolithically integrated in a common substrate with other components of the circuit arrangement. It may be a precision sensing resistor.

While FIG. 5 to FIG. 7 focus on providing an overcurrent signal, the circuit arrangement according to various embodiments may also be used for the measurement of a current, that is for providing a current value.

The embodiments of the circuit arrangement described above may be integrated in a power integrated circuit. A power integrated circuit may have a controller, a driver stage and a switching element which may be integrated in a die.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An circuit arrangement, comprising:
a first transistor, a second transistor and a third transistor configured so that the current flowing in the first transistor is proportional to the current flowing in the second transistor and the third transistor;
wherein the second transistor and the third transistor are coupled in series to each other;
wherein the first transistor, the second transistor and the third transistor are configured to operate in an ohmic mode; and
wherein the first transistor, the second transistor and the third transistor match each other in at least one characteristic;
further comprising:
a fourth transistor coupled between a first terminal of the third transistor and a first input of the amplifier; and
a fifth transistor coupled between a second terminal of the third transistor and a second input of the amplifier;
wherein the fourth transistor and the fifth transistor are configured to operate in an ohmic mode.

2. The circuit arrangement of claim 1, wherein the characteristic is one of:
a transistor type;
a temperature;
a location; and
a production process.

3. The circuit arrangement of claim 1, wherein the first transistor, the second transistor and the third transistor are monolithically integrated in a common substrate.

4. The circuit arrangement of claim 1, wherein the first transistor is a power transistor.

5. The circuit arrangement of claim 1, further comprising:
an amplifier configured to convert a voltage at an input of the amplifier into a current at an output of the amplifier, wherein the input of the amplifier is coupled to the third transistor.

6. The circuit arrangement of claim 5, wherein the amplifier is an operational transconductance amplifier.

7. The circuit arrangement of claim 5, further comprising:
a biasing circuit configured to bias the amplifier.

8. The circuit arrangement of claim 7, wherein the biasing circuit comprises a current source coupled to another input of the amplifier.

9. The circuit arrangement of claim 1, wherein the first transistor, the second transistor, the third transistor, the fourth transistor and the fifth transistor match each other in at least one characteristic.

10. The circuit arrangement of claim 9, wherein the characteristic is one of:
a transistor type;
a temperature;
a location; and
a production process.

11. The circuit arrangement of claim 10, wherein the first transistor, the second transistor, the third transistor, the fourth transistor and the fifth transistor are monolithically integrated in a common substrate.

12. The circuit arrangement of claim 1, further comprising:
a feedback structure configured to couple an output of the amplifier to an input of the amplifier.

13. The circuit arrangement of claim 12, wherein the feedback structure comprises a transistor coupled with a control input to the output of the amplifier and a controlled path coupled between an input of the amplifier and a reference potential.

14. The circuit arrangement of claim 12, further comprising:
a reproducing structure configured to reproduce a current through the feedback structure.

15. The circuit arrangement of claim 14, wherein the reproducing structure comprises a first branch, a second branch and a control input, wherein the first branch comprises the feedback structure; the second branch provides the proportional current; and the control input is coupled to the output of the amplifier.

16. The circuit arrangement of claim 1, wherein a control input of the third transistor, a control input of the fourth transistor and a control input of the fifth transistor are coupled to each other and are supplied with a common voltage, wherein the voltage is configured to operate the third transistor, the fourth transistor and the fifth transistor in a linear or ohmic region.

17. The circuit arrangement of claim 1, wherein the circuit arrangement is configured for high-side current sensing or is configured for low-side current sensing.

18. The circuit arrangement of claim 1, wherein the first transistor, the second transistor, the third transistor, the fourth transistor and the fifth transistor are all PFETs or are all NFETs.

19. The circuit arrangement of claim 1, further comprising: an overcurrent detection circuit.

* * * * *